(12) United States Patent
Nagase

(10) Patent No.: US 6,608,468 B2
(45) Date of Patent: Aug. 19, 2003

(54) BATTERY PACK COMPENSATING A CELL VOLTAGE, A CHARGE AND DISCHARGE CURRENT AND TEMPERATURE DATA, BY USING A BUILT-IN CPU FOR THE BATTERY PACK

(75) Inventor: Kazuhisa Nagase, Utsunomiya (JP)

(73) Assignee: NEC Mobile Energy Corporation, Utsunomiya (JP)

( * ) Notice: Subject to any disclaimer, the term of this patent is extended or adjusted under 35 U.S.C. 154(b) by 0 days.

(21) Appl. No.: 09/956,922

(22) Filed: Sep. 21, 2001

(65) Prior Publication Data

US 2002/0036481 A1 Mar. 28, 2002

(30) Foreign Application Priority Data

Sep. 25, 2000 (JP) ........................................ 2000-289666

(51) Int. Cl.[7] .................................................. H02J 7/00
(52) U.S. Cl. ...................................................... 320/132
(58) Field of Search ................................. 320/132, 134, 320/136, 137, 116, 118, 119, 150, 153; 702/63, 62, 64; 324/426, 427, 428, 431

(56) References Cited

U.S. PATENT DOCUMENTS 5,561,362 A * 10/1996 Kawamura et al. ......... 320/134
5,739,671 A * 4/1998 Hamada ...................... 320/149
6,437,540 B2 * 8/2002 Sonobe ........................ 320/134

* cited by examiner

Primary Examiner—Edward H. Tso
Assistant Examiner—Pia Tibbits
(74) Attorney, Agent, or Firm—Armstrong, Westerman & Hattori, LLP

(57) ABSTRACT

A battery pack containing a CPU and allowing correction of measured data is provided. The CPU has, at least, a main program for obtaining data concerning the voltage of each cell, charge/discharge current and temperature by measurement to control charging and discharging and to perform cumulative calculation of the remaining battery capacity, a communication program for communicating with an external device, and a correction program for acquiring measured data to obtain a correction factor for calculating a predetermined value from each item of the measured data and for storing the correction factor in a memory. After the state of each cell has been set to a predetermined value, the correction program is started to obtain a correction factor and to store it in the memory. The main program corrects each item of measured data concerning the cell voltage, charge/discharge current and temperature by the correction factor to control charging and discharging and to perform cumulative calculation of the remaining battery capacity. Thus, it is possible to increase the measurement accuracy even if low-cost members are used, and hence possible to reduce the costs.

7 Claims, 3 Drawing Sheets

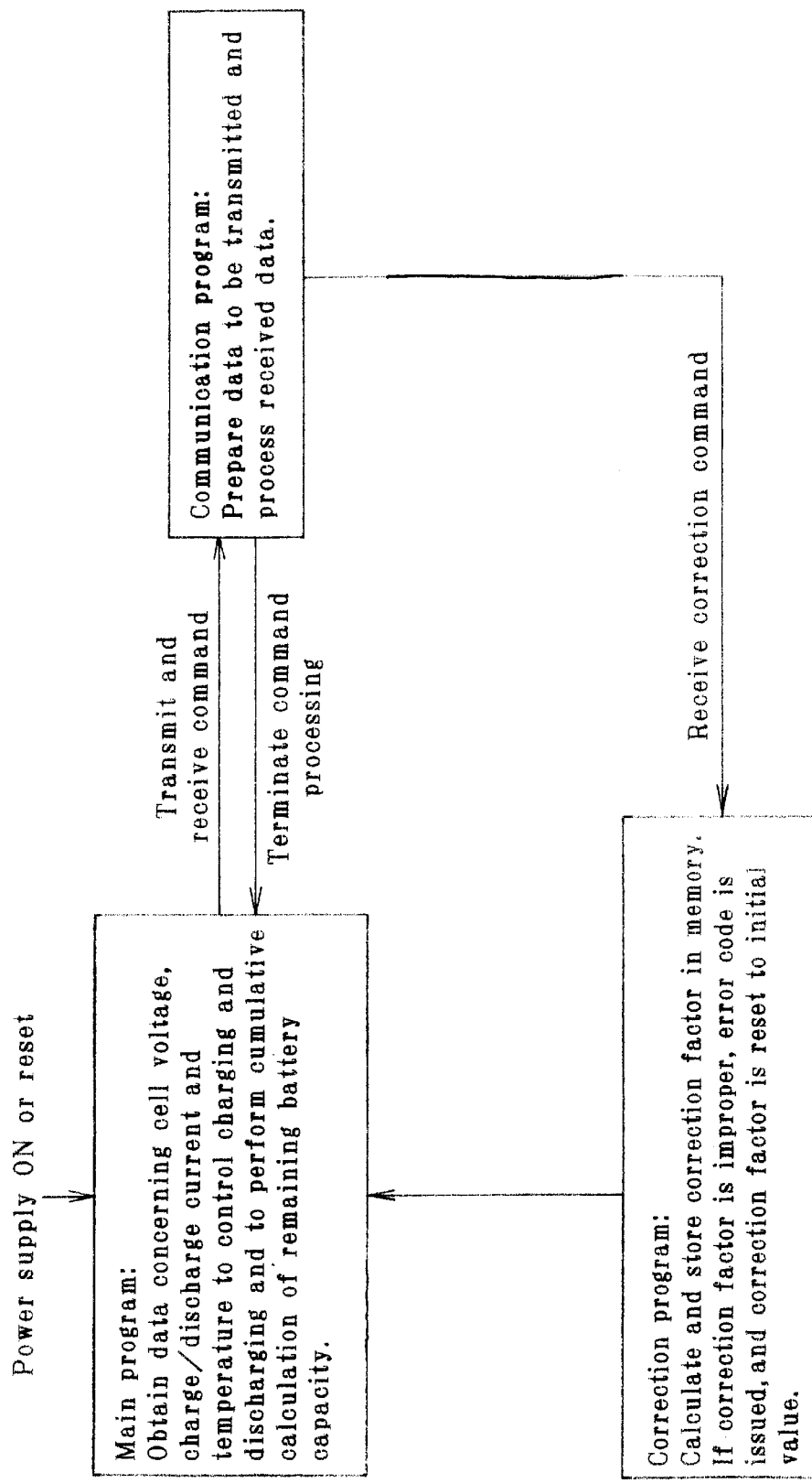

BATTERY PACK COMPENSATING A CELL VOLTAGE, A CHARGE AND DISCHARGE CURRENT AND TEMPERATURE DATA, BY USING A BUILT-IN CPU FOR THE BATTERY PACK

BACKGROUND OF THE INVENTION

The present invention relates to a battery pack containing a CPU and allowing correction of measured data.

In the normal CPU control performed in a battery pack containing a CPU (one-chip microcomputer), data concerning the cell voltage, charge/discharge current and temperature is obtained by measurement to control charging and discharging and to perform cumulative calculation of the remaining battery capacity. To increase the accuracy of measurement of the voltage, current and temperature, the conventional practice is to increase the accuracy of a resistor, an amplifier and other components used in the peripheral circuit and to minimize variations from product to product. Accordingly, it has heretofore been necessary to use high-precision and costly components. Consequently, the unit cost increases, and the battery pack itself becomes unfavorably costly.

SUMMARY OF THE INVENTION

The present invention was made to solve the above-described problems. Accordingly, an object of the present invention is to provide a battery pack in which data concerning the cell voltage, charge/discharge current and temperature is corrected so that the measurement accuracy can be increased even if low-cost members are used, thereby allowing the costs to be reduced.

To attain the above-described object, the present invention provides a battery pack containing a CPU and allowing correction of measured data. The CPU has, at least, a main program for obtaining data concerning the voltage of each cell, charge/discharge current and temperature by measurement to control charging and discharging and to perform cumulative calculation of the remaining battery capacity, a communication program for communicating with an external device, and a correction program for acquiring measured data to obtain a correction factor for calculating a predetermined value from each item of the measured data and for storing the correction factor in a memory. After the state of each cell has been set to a predetermined value, the correction program is started to obtain a correction factor and to store it in the memory. The main program corrects each item of measured data concerning the cell voltage, charge/discharge current and temperature by the correction factor to control charging and discharging and to perform cumulative calculation of the remaining battery capacity.

The correction program judges whether or not the correction factor obtained is within a predetermined range, and stores the correction factor in the memory on condition that the correction factor is within the predetermined range. The correction program has an initial value for the correction factor and stores the initial value in the memory when a correction factor cannot be obtained by the correction program, or when the correction factor obtained is not within a predetermined range. The correction program outputs error information to the outside when the correction factor obtained is not within the predetermined range. The correction program is started when the communication program receives a predetermined command issued from the external device. Alternatively, the correction program is started in response to an operation of an idle port of the CPU.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 1(A) and 1(B) are diagrams for describing an embodiment of the battery pack according to the present invention.

DESCRIPTION OF PREFERRED EMBODIMENTS

Figure 1B:
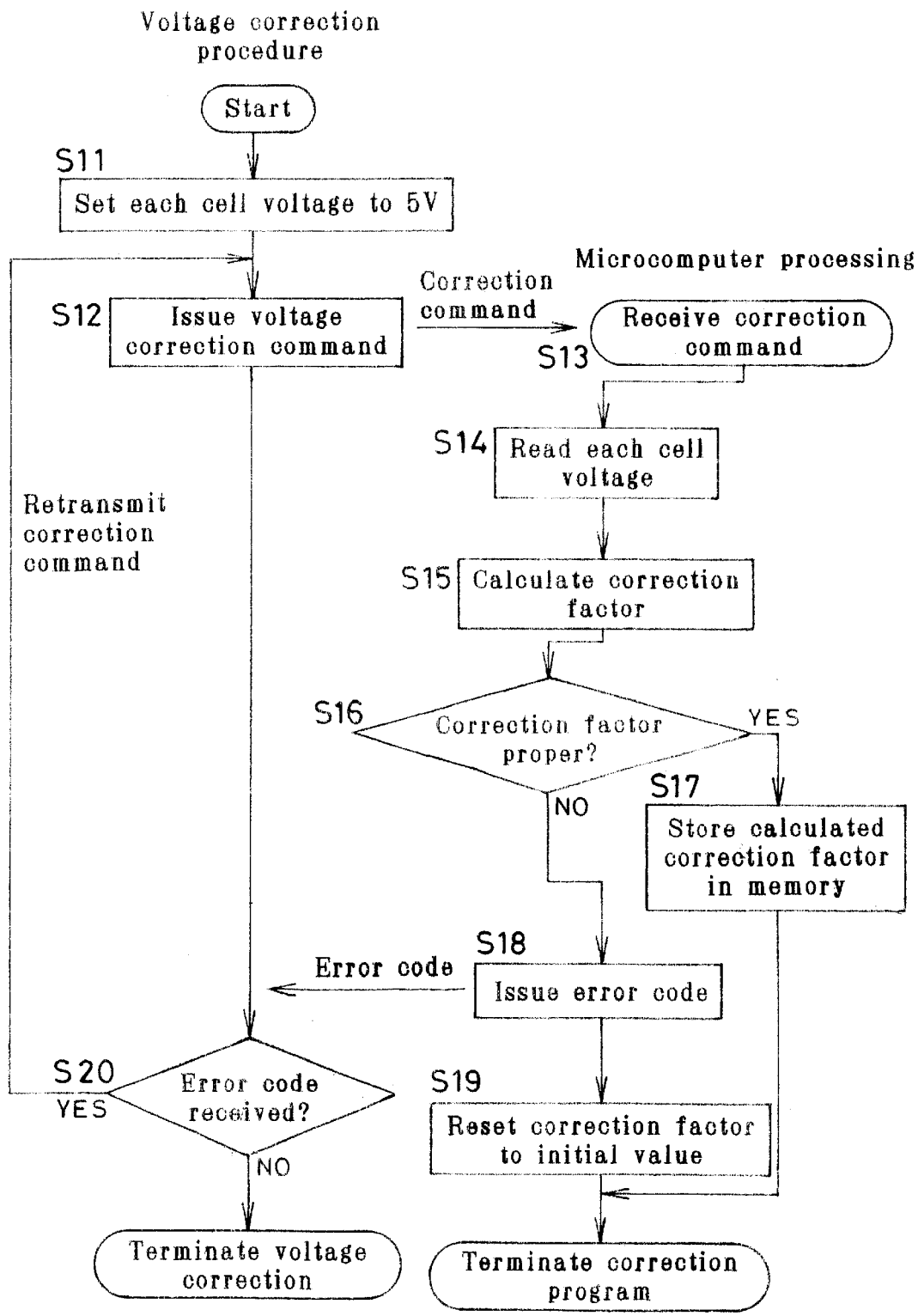

An embodiment of the battery pack according to the present invention will be described below with reference to the accompanying drawings.

A CPU (one-chip microcomputer) contained in the battery pack has, as shown in FIG. 1(A), a main program for obtaining data concerning the cell voltage, charge/discharge current and temperature to control charging and discharging and to perform cumulative calculation of the remaining battery capacity. The CPU further has a communication program for communicating with an external device, and a correction program for making correction when a command for correcting the voltage, current or temperature data is received by the communication program.

In the battery pack, normal CPU control is performed by the main program. The main program obtains data concerning the cell voltage, charge/discharge current and temperature by measurement to control charging and discharging and to perform cumulative calculation of the remaining battery capacity. At the time of receiving data from the external device and transmitting data to the external device, the main program calls the communication program, as necessary, to execute communication processing.

The communication program executes preparation of data to be transmitted and processing of received data. When the communication program receives a predetermined command from the external device, the control shifts from the main program to the correction program. The command used at this time needs to have high concealability.

When receiving a correction command, the correction program measures data concerning the cell voltage, charge/discharge current or temperature and performs calculation to determine a correction factor that allows the value of the measured data to be corrected to a predetermined value. If the calculated correction factor is outside a certain range, it is possible that there is an error in the voltage, current or temperature data that has been inputted to the chip, or there is a circuit failure. Therefore, an error code is issued, and the correction factor is reset to the initial value. If the correction factor is judged to be proper, it is stored in a memory as it is. When the voltage, current or temperature is measured, the value of the measured data is multiplied by the correction factor, and the result is used as the correct value of the measured data.

Thus, in the battery pack according to the present invention, when a predetermined command is input thereto from the external device by communication, the control shifts from the main program to the correction program.

Then, data concerning the voltage, current or temperature is read, and a correction factor is calculated to allow the voltage, current or temperature data to be corrected to an accurate value.

Even before the correction is made, an approximately correct value can be calculated because the initial value (theoretical value) of the correction factor is substituted. After the correction has been made, a judgment is made as to whether or not the correction factor is proper. If the correction factor is judged to be NG (no good), an error code is communicated to the outside. When it is judged that the correction factor is NG, the initial value (theoretical value) of the correction factor is substituted again to prevent the voltage, current or temperature data from becoming an improper value, which would otherwise cause the battery pack to fail to perform its function.

The following is a description of an example of the voltage correction procedure for calculating and storing a correction factor for the cell voltage. Let us assume that a correction factor is determined so that the cell voltage becomes 5 V. It is also assumed that the correction factor is judged to be a proper value when it is within the range of 0.9 to 1.1.

In the voltage correction procedure, as shown in FIG. 1(B), first, each cell voltage is set to 5 V by the external device (step S11), and a cell voltage correction command is issued to the battery pack (step S12).

When receiving the correction command (step S13), the CPU of the battery pack shifts from the main program to the correction program. The CPU measures the cell voltage and reads the value of the measured voltage (step S14). Then, the CPU performs calculation to determine a correction factor (step S15) as follows:

Correction factor=5 V/measured voltage value

Then, a check is made as to whether or not the calculated correction factor is within the range of 0.9 to 1.1 (step S16). If the correction factor is within the range, the value is stored in the memory as a correction factor (step S17). If the correction factor is not within the range, an error code is issued (step S18), and the correction factor is reset to the initial value (step S19).

With the above-described processing, the CPU of the battery pack terminates the correction program and returns to the main program. After the execution of the correction program, the main program measures the voltage and current and corrects the measured value by using the correction factor stored in the memory as follows:

Corrected value=measured value×correction factor

After the completion of the correction, the external device judges whether or not an error code has been received (step S20). If an error code is received, the external device transmits the correction command again (step S12).

Figure 2:
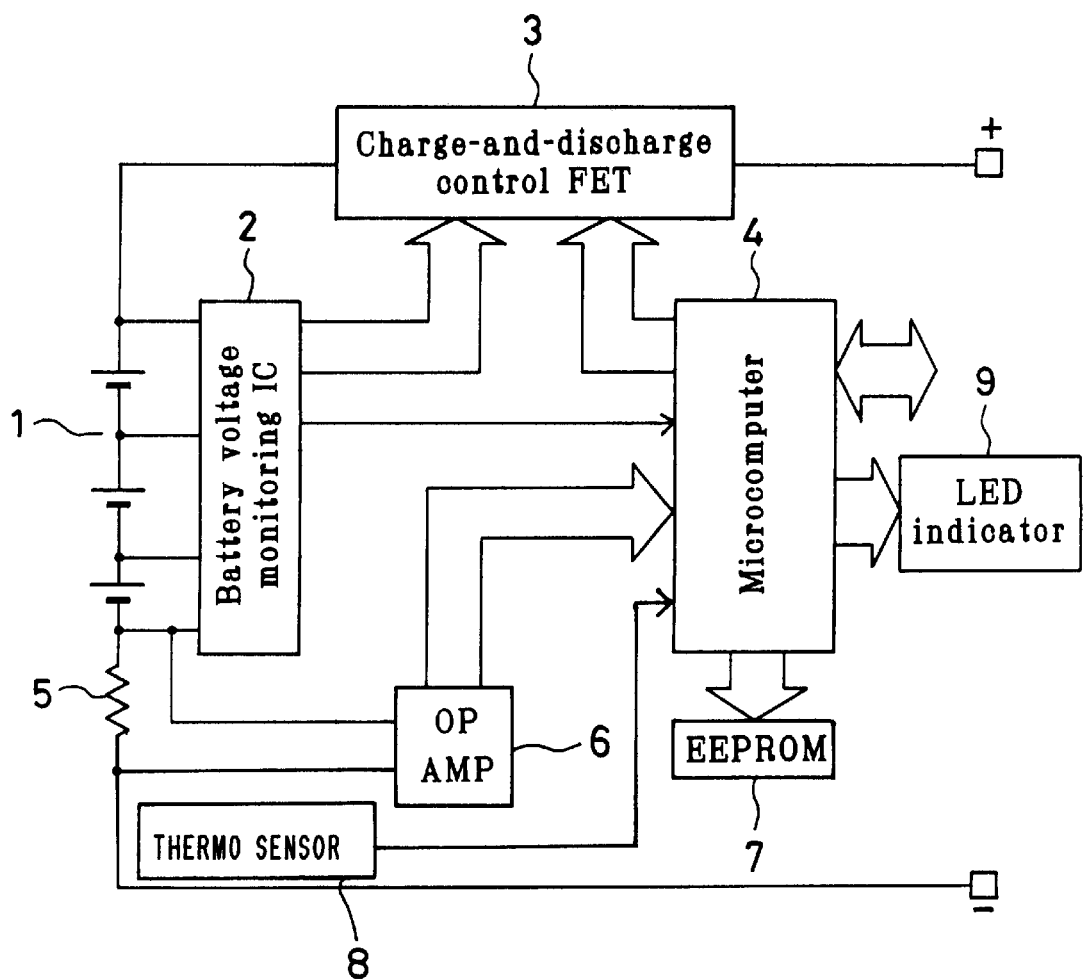
FIG. 2 is a block diagram showing the arrangement of the battery pack according to the present invention.

FIG. 2 is a block diagram showing the arrangement of the battery pack according to the present invention. In the figure, reference numeral 1 denotes a battery; 2 denotes a battery voltage monitoring IC; 3 denotes a charge-and-discharge control FET; 4 denotes a microcomputer; 5 denotes a current detecting resistor; 6 denotes an operational amplifier; 7 denotes an EEPROM; 8 denotes a temperature sensor; and 9 denotes an LED indicator.

In FIG. 2, the battery 1 is a secondary battery having three cells connected in series. The current detecting resistor 5 detects a charge/discharge current I of the battery 1. The operational amplifier 6 amplifies a small voltage detected by the current detecting resistor 5. The battery voltage monitoring IC 2 is a protecting IC that detects the battery voltage and performs charge-and-discharge control. The microcomputer 4 has the above-described main program, communication program and correction program and performs various control operations, abnormality detection and so forth in the battery pack. The microcomputer 4 executes arithmetic processing for the control and other operations and communicates with an external host device. The EEPROM 7 is a storage device for storing programs, control data, abnormality data, historical and accumulated data, etc. The temperature sensor 8 is used to detect the temperature of the cell. The charge-and-discharge control FET 3 is a switching element for on-off controlling charging and discharging in response to a signal from the battery voltage monitoring IC 2 or the microcomputer 4. The LED indicator 9 indicates the remaining battery capacity. Further, when a thermal fuse is fused, the LED indicator 9 indicates abnormality information in the form of a binary code with several bits, for example automatically or in response to pushing a switch provided separately.

It should be noted that the present invention is not limited to the foregoing embodiment but can be modified in a variety of ways. For example, in the above-described embodiment, correction is made in response to issuance of a predetermined command. However, correction may be made by operating an idle port of the one-chip CPU instead of issuing a command by communication.

As will be clear from the foregoing description, the present invention provides a battery pack containing a CPU and allowing correction of measured data. The CPU has, at least, a main program for obtaining data concerning the voltage of each cell, charge/discharge current and temperature by measurement to control charging and discharging and to perform cumulative calculation of the remaining battery capacity, a communication program for communicating with an external device, and a correction program for acquiring measured data to obtain a correction factor for calculating a predetermined value from each item of the measured data and for storing the correction factor in a memory. After the state of each cell has been set to a predetermined value, the correction program is started to obtain a correction factor and to store it in the memory. The main program corrects each item of the measured data concerning the cell voltage, charge/discharge current and temperature by the correction factor to control charging and discharging and to perform cumulative calculation of the remaining battery capacity. Therefore, even if low-cost members are used, the measurement accuracy can be increased by correcting the measured data concerning the cell voltage, charge/discharge current and temperature, and hence the costs can be reduced.

The correction program judges whether or not the correction factor obtained is within a predetermined range, and stores the correction factor in the memory on condition that the correction factor is within the predetermined range. The correction program has an initial value for the correction factor and stores the initial value in the memory when a correction factor cannot be obtained by the correction program, or when the correction factor obtained is not within a predetermined range. The correction program outputs error information to the outside when the correction factor obtained is not within the predetermined range. Therefore, when there is an error in the voltage, current or temperature data that has been inputted to the chip, or there is a circuit failure, it is possible to prevent the correction factor from being used as it is. Further, the correction program is started when the communication program receives a predetermined command issued from the external device. Alternatively, the correction program is started in response to an operation of an idle port of the CPU. Therefore, the correction operation can be performed easily. Accordingly, even if the conventionally used high-precision components are replaced with low-cost components with an average degree of accuracy, the voltage, current and temperature can be measured with high accuracy, and it is possible to perform the remaining battery capacity control and the charging and discharging control even more accurately.

I claim:

1. A battery pack containing a CPU and allowing correction of measured data, wherein said CPU has at least:
   - a main program for obtaining data concerning a voltage of each cell, charge/discharge current and temperature to control charging and discharging and to perform cumulative calculation of a remaining battery capacity;
   - a communication program for communicating with an external device; and
   - a correction program for acquiring measured data to obtain a correction factor for calculating a predetermined value from each item of said measured data and for storing said correction factor in a memory;

wherein after a state of each cell has been set to a predetermined value, said correction program is started to obtain a correction factor and to store the correction factor in said memory, and said main program corrects each item of measured data concerning the voltage of each cell, charge/discharge current and temperature by the correction factor to control charging and discharging and to perform cumulative calculation of a remaining battery capacity.

2. A battery pack according to claim 1, wherein said correction program judges whether or not the correction factor obtained is within a predetermined range, and stores the correction factor in the memory on condition that the correction factor is within the predetermined range.

3. A battery pack according to claim 1 or 2, wherein said correction program has an initial value for the correction factor and stores said initial value in said memory when a correction factor cannot be obtained by said correction program, or when the correction factor obtained is not within a predetermined range.

4. A battery pack according to claim 3, wherein said correction program outputs error information to an outside when the correction factor obtained is not within the predetermined range.

5. A battery pack according to claim 1, wherein said correction program is started when the communication program receives a predetermined command issued from the external device.

6. A battery pack according to claim 1, wherein said correction program is started in response to an operation of an idle port of said CPU.

7. A battery pack according to claim 2, wherein said correction program outputs error information to an outside when the correction factor obtained is not within the predetermined range.

* * * * *

UNITED STATES PATENT AND TRADEMARK OFFICE
CERTIFICATE OF CORRECTION

PATENT NO.   : 6,608,468 B2
DATED        : August 19, 2003
INVENTOR(S)  : Kazuhisa Nagase It is certified that error appears in the above-identified patent and that said Letters Patent is hereby corrected as shown below:

Title page,
Item [73], Assignee: change "NEC Mobile Energy Corporation" to be -- NEC Tokin Tochigi, Ltd. --

Signed and Sealed this

Thirteenth Day of April, 2004

JON W. DUDAS
*Acting Director of the United States Patent and Trademark Office*